United States Patent
Wang

(10) Patent No.: US 7,319,058 B2
(45) Date of Patent: Jan. 15, 2008

(54) FABRICATION METHOD OF A NON-VOLATILE MEMORY

(75) Inventor: Ting-Sing Wang, Hsinchu Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 58 days.

(21) Appl. No.: 11/161,724

(22) Filed: Aug. 15, 2005

(65) Prior Publication Data
US 2006/0275976 A1  Dec. 7, 2006

(30) Foreign Application Priority Data
Jun. 7, 2005 (TW) .............................. 94118693 A

(51) Int. Cl.
*H01L 21/336* (2006.01)

(52) U.S. Cl. .................. 438/259; 438/258; 438/261; 438/263; 438/266; 438/287; 257/E21.179; 257/E21.18; 257/E21.422; 257/E21.68

(58) Field of Classification Search ................ 438/251, 438/258, 259, 261, 263, 266, 287, 288, 268, 438/269, 270, 589, 595, 596; 257/316, 321, 257/330, 390, 405, E21.179, E21.18, E21.422, 257/E21.68, E21.685, E21.686, E21.687, 257/E21.688
See application file for complete search history.

(56) References Cited

U.S. PATENT DOCUMENTS

| 6,091,102 A | 7/2000 | Sekariapuram et al. ...... 257/316 |
| 6,440,801 B1 * | 8/2002 | Furukawa et al. .......... 438/272 |
| 6,842,370 B2 | 1/2005 | Forbes ....................... 365/177 |
| 2004/0197995 A1 | 10/2004 | Lee et al. .................... 438/257 |

* cited by examiner

*Primary Examiner*—George R. Fourson
*Assistant Examiner*—Julio J. Maldonado
(74) *Attorney, Agent, or Firm*—Jianq Chyun IP Office

(57) ABSTRACT

A fabrication method for a non-volatile memory is provided. To fabricate the non-volatile memory, a plurality of first trenches and second trenches are formed in a substrate, wherein the second trenches are disposed above the first trenches and cross over the first trenches. Then, a tunneling layer and a charge storage layer are sequentially formed on both sidewalls of each second trench. An isolation layer is filled into the first trench. Furthermore, a charge barrier layer is formed on the sidewall of the second trench, and a gate dielectric layer is formed at the bottom of the second trench. A control gate layer is filled into the second trench. Finally, two first doping regions are formed in the substrate at both sides of the control gate layer.

8 Claims, 7 Drawing Sheets

FABRICATION METHOD OF A NON-VOLATILE MEMORY

CROSS-REFERENCE TO RELATED APPLICATION

This application claims the priority benefit of Taiwan application serial no. 94118693, filed on Jun. 7, 2005. All disclosure of the Taiwan application is incorporated herein by reference.

BACKGROUND OF THE INVENTION

1. Field of Invention

The present invention relates to a memory device and a fabrication method thereof, and particularly to a non-volatile memory (NVM) and a fabrication method thereof.

2. Description of the Related Art

Non-volatile memories (NVMs) can be written, erased and retain data after power is off. In addition, NVMs have other advantages such as small size, fast access speed and low electricity consumption. Since data is erased "block by block", the operation speed of NVMs is fast. Therefore, the NVM has become a memory device widely applied in PC and various electronic devices.

A NVM comprises a plurality of memory cells (MCs) arranged in an array. Wherein, each MC is formed by a tunneling layer, a charge storage layer, a charge barrier layer and a control gate layer stacked in sequence. Besides, at both sides of the gate in the substrate are disposed with two doping regions serving as a source region and a drain region, respectively.

As data is written into the memory, a bias voltage is applied to the control gate layer, the source region and the drain region to inject electrons into the control gate layer. When data is read from the memory, an operation voltage is applied to the control gate layer. The charging status of the charge storage layer affects the switching on/off status of the channel underneath, which serves to determine the "0" or "1" of the data value. While data in the memory is erased, the relative voltage levels of the substrate, the source region, the drain region or the control gate layer are increased, so that the electrons in the charge storage layer penetrate through the tunneling layer into the substrate by a tunneling effect. The erasing method is usually termed as "substrate erase".

Note that although the IC develops towards higher integrity and minimal size, yet along with larger application software today, the required memory capacity is accordingly bigger. To adapt such challenge where a memory is required to have a smaller size with a bigger capacity, the conventional memory cell (MC) structure and the fabrication method thereof must be modified and updated. In fact, it has been an important topic in the deep sub-micron (DSM) technology to enhance the level of integration while keeping the original memory capacity in a limited space.

SUMMARY OF THE INVENTION

Accordingly, an object of the present invention is to provide a fabrication method of non-volatile memories (NVMs) for enhancing the level of integration.

Another object of the present invention is to provide a non-volatile memory (NVM), wherein a single memory unit is able to serve as a multi-stage MC.

The present invention provides a fabrication method of NVMs. In the process, a substrate is provided. Next, in the substrate, a plurality of first trenches and a plurality of second trenches are formed, and the second trenches are located above and across the first trenches. A tunneling layer and a charge storage layer are sequentially formed on the sidewall of each of the second trenches. Further, an isolation layer is filled into each of the first trenches. A charge barrier layer is formed on the sidewall of each the second trench to cover the corresponding charge storage layer. Besides, a gate dielectric layer is formed on the bottom of each of the second trenches, and the gate dielectric layer covers at least a partial substrate between two adjacent first trenches. A control gate layer is filled into each of the second trenches. A plurality of first doping regions are formed in the substrate at both sides of the control gate layer.

According to the fabrication method of NVMs in the embodiments of the present invention, after forming the gate dielectric layer, the method further includes forming a plurality of second doping regions on the bottom of each second trench. Moreover, before forming the second doping regions, an isolation spacer may be formed on each charge barrier layer located on the sidewall of each second trench. To form the isolation spacer, a spacer material layer is formed in each of the second trenches, then the spacer material layer is anisotropically etched.

According to the fabrication method of NVMs in the embodiments of the present invention, the method for forming the aforementioned first trenches and second trenches is, for example, by using a first patterned mask to form the second trenches, which are extended in a first extension direction, and then using a second patterned mask to form the second trenches in a second extension direction. The first extension direction crosses the second extension direction and the depth of the first trench is deeper than that of the second trench.

According to the fabrication method of NVMs in the embodiments of the present invention, the method for filling the above-described isolation layer into the first trench is by, for example, forming an isolation material layer on the substrate, and then a chemical mechanical polish (CMP) process is performed for removing partial isolation material layer outside the second trench until a portion of the substrate between two adjacent second trenches is exposed. Further, an etching process is performed for removing the partial isolation material layer in the second trench until the bottom of the second trench and partial substrate between two adjacent first trenches are exposed.

The present invention provides a NVM, which comprises a substrate, a control gate layer, a charge storage layer, a tunneling layer, a charge barrier layer, a gate dielectric layer and a first doping region. Wherein, the control gate layer is disposed in a first trench of the substrate; the charge storage layer is disposed between the sidewall of the first trench and the control gate layer; the tunneling layer is disposed between the sidewall of the first trench and the charge storage layer; the charge barrier layer is disposed between the charge storage layer and the control gate layer; the gate dielectric layer is disposed between the bottom of the first trench and the control gate layer; and the first doping region is disposed in the substrate at one side of the control gate layer.

According to the embodiments of the present invention, the NVM further includes a second doping region disposed on the bottom of the first trench.

According to the embodiments of the present invention, the NVM further includes an isolation spacer disposed between the charge barrier layer on the sidewall of the first trench and the control gate layer.

According to the embodiments of the present invention, the NVM further includes an isolation layer disposed in a second trench of the substrate. Wherein, the first trench is located across and above the second trench.

According to the embodiments of the present invention, the depth of the above-mentioned second trench is deeper than that of the first trench.

In the NVM of the present invention, if no second doping region and isolation spacer are disposed, each of the charge storage layers located at both sides of each memory unit in the trench is used for storing 1-bit. In other words, one memory unit has one memory cell, which can store 2-bit. If a second doping region is disposed, the second doping region is used as a source/drain region; thus, each memory unit in the trench has two memory cells located at both sides of the trench and the charge storage layer of each memory cell can be used for storing 1-bit. Therefore, a memory unit can be used as a multi-stage memory cell. Besides, the thickness of the corresponding isolation spacer can be used to control the width of a second doping region. Further, the arrangement manner of the memory units according to the present invention also makes effective use of a wafer space, increasing the device integration level. Moreover, the process is simpler.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
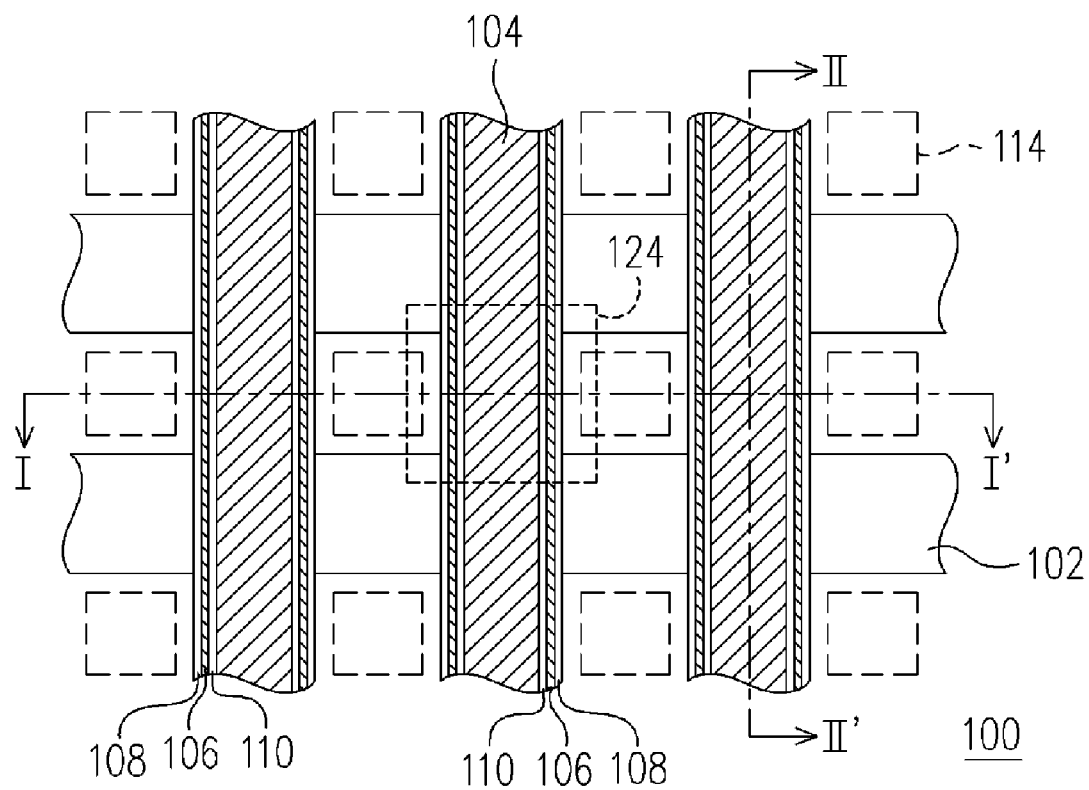
FIG. 1 is a schematic top view of a non-volatile memory (NVM) according to an embodiment of the present invention.
Figure 2A:
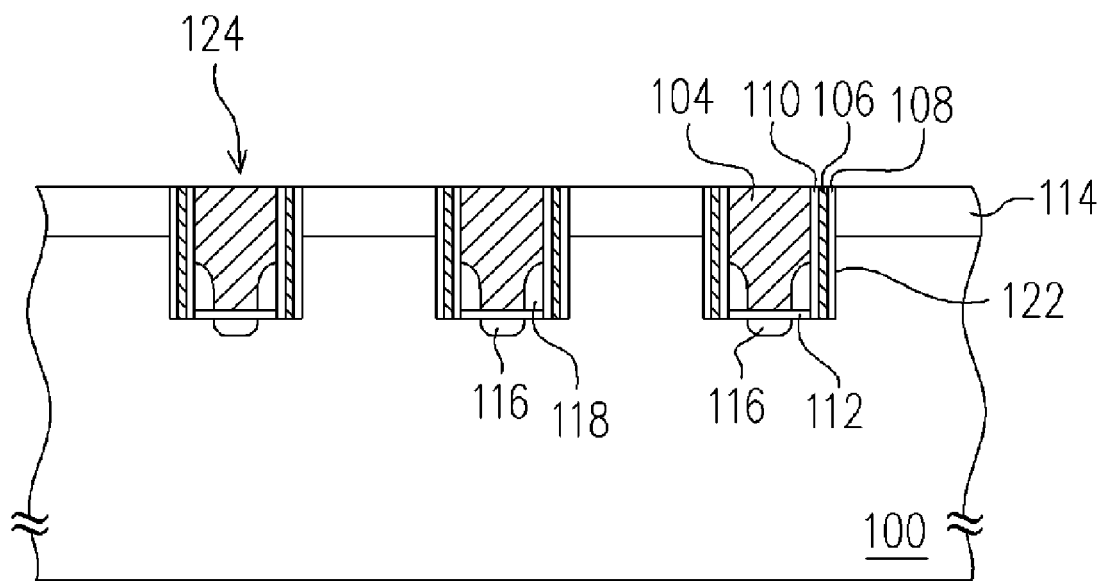
FIG. 2A is a schematic cross-sectional drawing along side I-I' in FIG. 1.
Figure 2B:
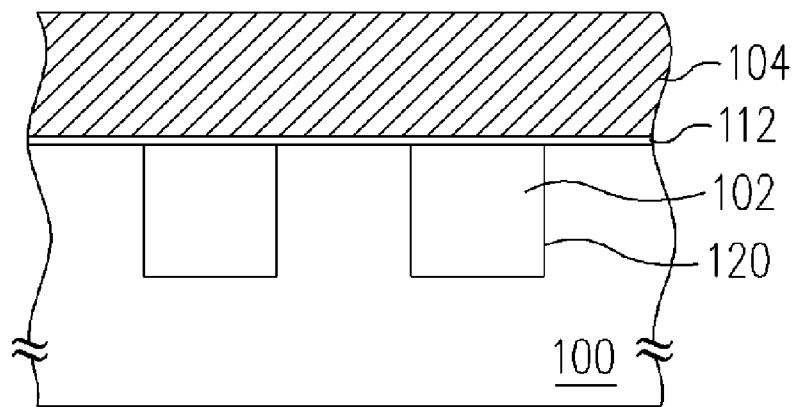
FIG. 2B is a schematic cross-sectional drawing along side II-II' in FIG. 1.

FIG. 1 is a schematic top view of a non-volatile memory (NVM) according to an embodiment of the present invention. FIG. 2A is a schematic cross-sectional drawing along side I-I' in FIG. 1. FIG. 2B is a schematic cross-sectional drawing along side II-II' in FIG. 1.

Referring to FIG. 1, FIG. 2A and FIG. 2B, the non-volatile memory (NVM) of the present invention includes a substrate 100, a plurality of isolation layers 102, a plurality of control gate layers 104, a plurality of charge storage layers 106, a plurality of tunneling layers 108, a plurality of charge barrier layers 110, a plurality of gate dielectric layers 112, and a plurality of doping regions 114. In an embodiment, the NVM of the present invention further includes a plurality of doping regions 116 and a plurality of isolation spacers 118. Wherein, the substrate 100 is, for example, a silicon substrate. In addition, the substrate 100 further includes a plurality of trenches 120 and 122, and the trenches 122 overpass the trenches 120.

The isolation layer 102 is filled into the trench 120 and made of silicon oxide, for example. The control gate layer 104 is filled into the trench 122 and overpasses the isolation layer 102. The control gate layer 104 is made of, for example, polysilicon, doped polysilicon or other appropriate conductive material. The charge storage layer 106 is disposed between a sidewall of the trench 122 and the control gate layer 104 and made of, for example, silicon nitride or other materials capable of storing charges.

The tunneling layer 108 is disposed between a sidewall of the trench 122 and the charge storage layer 106 and made of, for example, silicon oxide or other materials capable for charge tunneling. The charge barrier layer 110 is disposed between the charge storage layer 106 and the control gate layer 104 and made of, for example, silicon oxide or other isolation materials.

The gate dielectric layer 112 is disposed between the bottom of the trench 122 and the control gate layer 104 and made of, for example, silicon oxide. The doping region 114 is disposed in the substrate 100 at both sides of the control gate layer 104. The doping region 114 is, for example, an N+ doping region and serves as a source/drain.

The doping region 116 is disposed at the bottom of each trench 122 in the substrate 100 between two adjacent trenches 120. The doping region 116 is, for example, an N+ doping region and serves as a source/drain. In addition, the isolation spacer 118 is disposed between the charge barrier layer 110 and the control gate layer 104, wherein the charge barrier layer 110 is on a sidewall of each trench 122. The isolation spacer 118 is made of silicon oxide, for example.

Figure 2C:
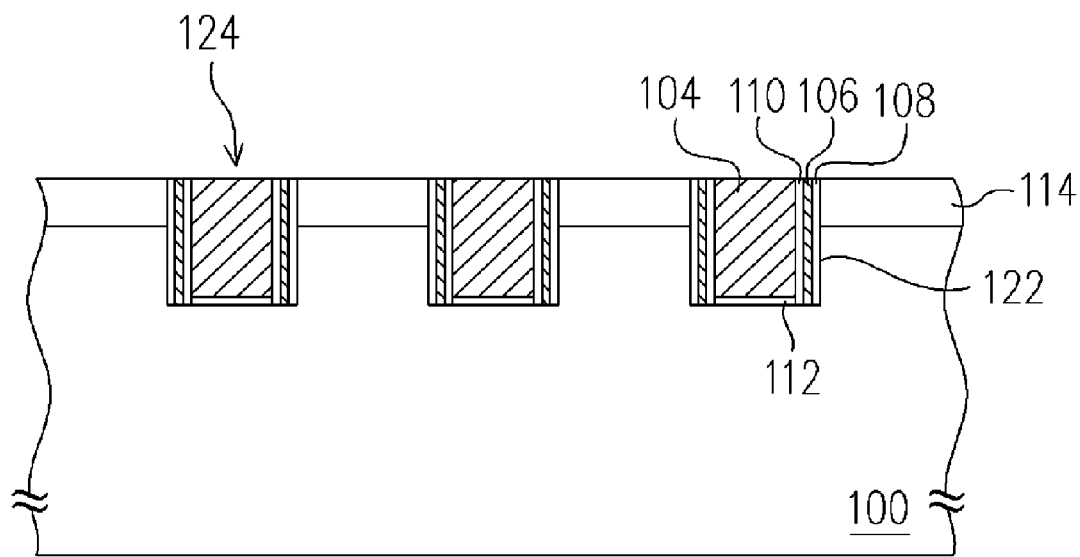
FIG. 2C is a schematic cross-sectional drawing of a non-volatile memory (NVM) according to another embodiment of the present invention.

A non-volatile memory (NVM) according to another embodiment of the present invention is shown in FIG. 2C. If no doping region 116 and no isolation spacer 118 are disposed in a NVM, each of the charge storage layers 106 separately located at both sides of each memory unit (for example, 124 in FIG. 1 and FIG. 2C) can store 1-bit. In other words, one memory unit having one memory cell serves for storing 2-bit. In another embodiment (FIG. 2D) where the NVM is disposed with doping regions 116, the doping region 116 serves as a source/drain region as well; thus, each memory unit (for example, 124 in FIG. 1 and FIG. 2D) has two memory cells located at both sides of the trench 122, and the charge storage layer 106 of each memory cell can store 1-bit. Therefore, such a memory unit can be used as a multi-stage memory cell. Besides, the memory unit with the doping region 116 and the isolation spacer 118 (FIG. 1 and FIG. 2A) has the same advantage as above-described.

Further, the arrangement manner of the NVMs in the present invention makes effective use of the wafer space, and enhances the device integration level. In addition, the arrangement manner of the NVMs in the present invention is particularly suitable for operating NOR gate (Not Or Gate) NVMs.

FIGS. 3A-3D and FIGS. 4A-4D are the process of manufacturing the above-described NVM. Wherein, FIGS. 3A-3D are schematic cross-sectional drawings along side I-I' in FIG. 1 and FIGS. 4A-4D are schematic cross-sectional drawings along side II-II' in FIG. 1.

Figure 3A:
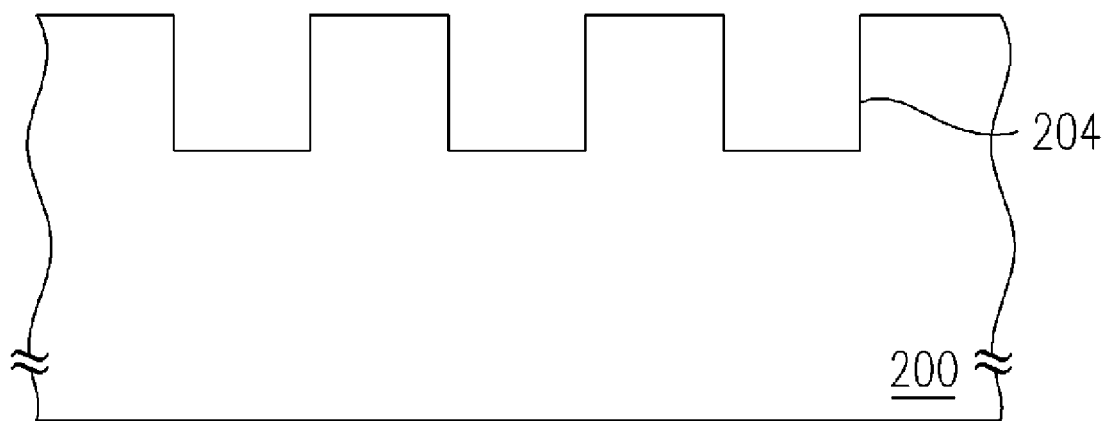
FIGS. 3A-3D are schematic cross-sectional drawings showing a process of manufacturing a non-volatile memory (NVM) according to an embodiment of the present invention.
Figure 4A:
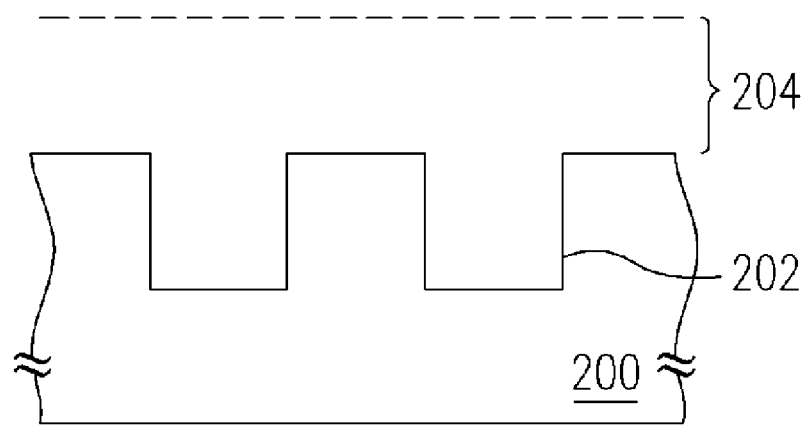
FIGS. 4A-4D are schematic cross-sectional drawings showing a process of manufacturing a non-volatile memory (NVM) according to an embodiment of the present invention.

First, referring to FIGS. 3A and 4A, a substrate 200 is provided. The substrate 200 is, for example, a silicon substrate. Then, a plurality of trenches 202 and 204 are formed in the substrate 200, wherein the trenches 204 overpass the trenches 202. In more detail, the top surface of the substrate 200 shown in FIG. 4A actually refers to the bottom of the trench 204. In other words, the trench 202 is deeper than the trench 204. In an embodiment, to form the trenches 202 and 204, a patterned mask is used (not shown) to form the trench 204 in an extending direction in the substrate 200, and then the trench 202 is formed in another direction in the substrate 200 with another patterned mask (not shown). In another embodiment, a patterned mask is used (not shown) to form the trench 202 in an extending direction in the substrate 200, and then the trench 204 is formed in another direction in the substrate 200 with another patterned mask (not shown).

Figure 3B:
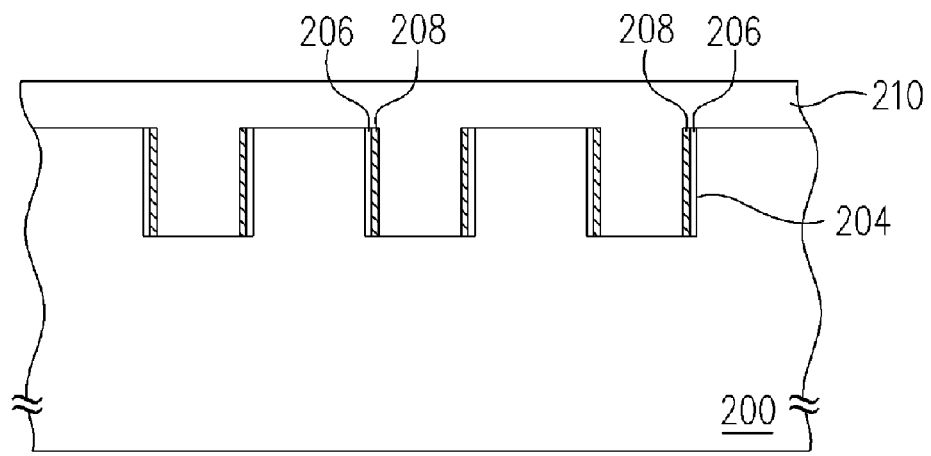
Figure 4B:
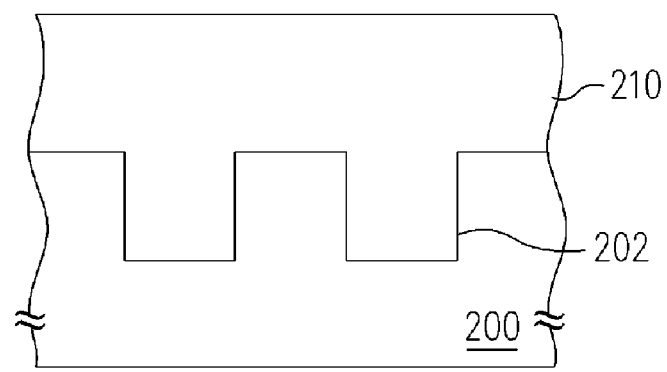

Next, referring to FIGS. 3B and 4B, on a sidewall of the trench 204, a tunneling layer 206 and a charge storage layer 208 are sequentially formed. Wherein, the tunneling layer 206 is made of, for example, silicon oxide or other materials capable of charge tunneling. The charge storage layer 208 is made of, for example, silicon nitride or other materials capable of storing charges.

An isolation material layer 210 is formed on the substrate 200. The isolation material layer 210 is made of, for example, silicon oxide or other isolation materials formed by, for example, chemical vapor deposition (CVD) process.

Figure 3C:
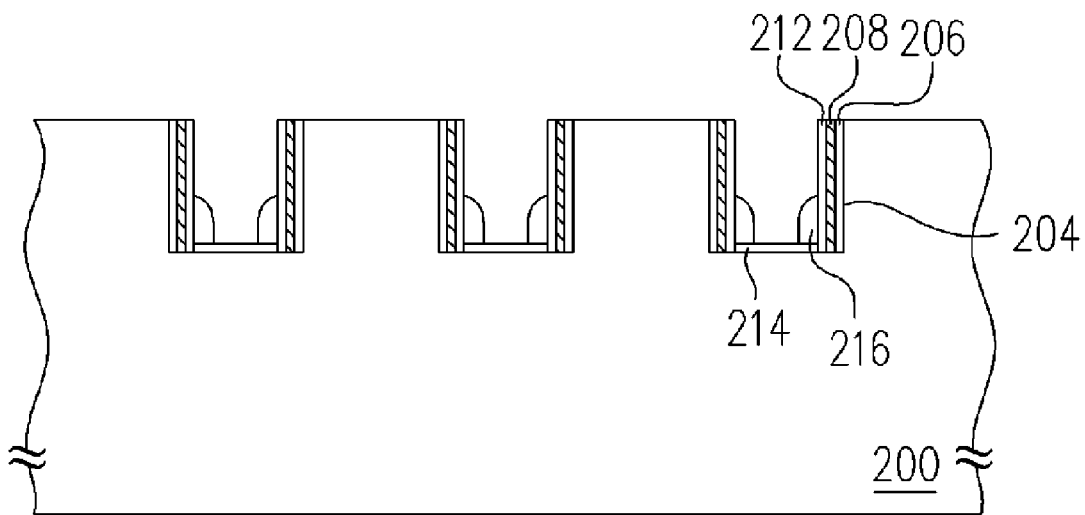
Figure 4C:
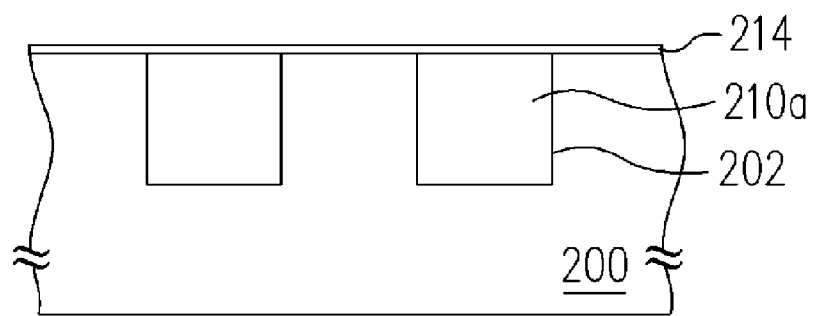

Further, referring to FIGS. 3C and 4C, the isolation material layer 210 outside the trench 204 is removed until the substrate 200 between two adjacent trenches 204 is exposed. To remove the isolation material layer 210 outside the trench 204, for example, a chemical mechanical polish (CMP) process is performed. Then, the isolation material layer 210 in the trench 204 is removed until the bottom of the trench 204 is exposed. In addition, the substrate 200 between two adjacent trenches 202 is also exposed and an isolation layer 210a is accordingly formed. The isolation material layer 210 can be removed from the trench 204 in an etching process, for example, and the formed isolation layer 210a can serve as an isolation structure.

Furthermore, a charge barrier layer 212 is formed on the sidewall of the trench 204 to cover the charge storage layer 208, and a gate dielectric layer 214 is formed on the bottom of the trench 204. The formed gate dielectric layer 214 covers at least the substrate 200 between two adjacent trenches 202, and covers the isolation layer 210a, too. In an embodiment, the charge barrier layer 212 and the gate dielectric layer 214 are made of silicon oxide, and a thermal oxidation process is performed for forming the gate dielectric layer 214. In another embodiment, the charge barrier layer 212 is formed after forming the charge storage layer 208 in FIG. 3B but before forming the isolation material layer 210.

A pair of isolation spacers 216 are formed on the charge barrier layers 212 on two sidewalls of each trench 204. The isolation spacer 216 is made of, for example, silicon oxide, and is formed by first forming a spacer material layer (not shown) on the substrate 200 for covering the entire structure, followed by an anisotropic etching process. In another embodiment, the charge barrier layers 212 and the isolation spacer 216 are formed first, followed by the gate dielectric layer 214.

Figure 3D:
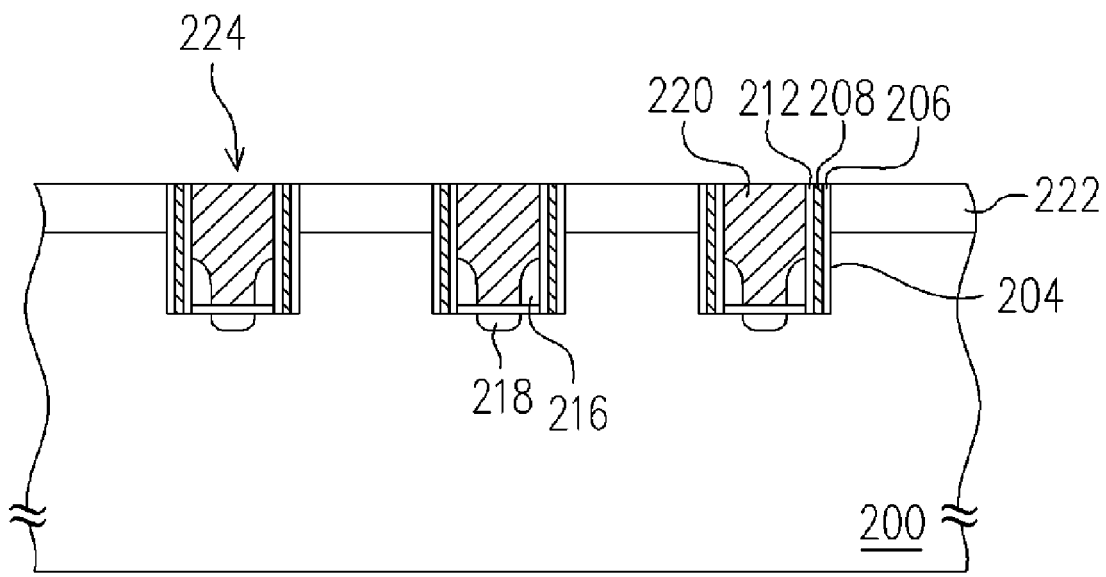
Figure 4D:
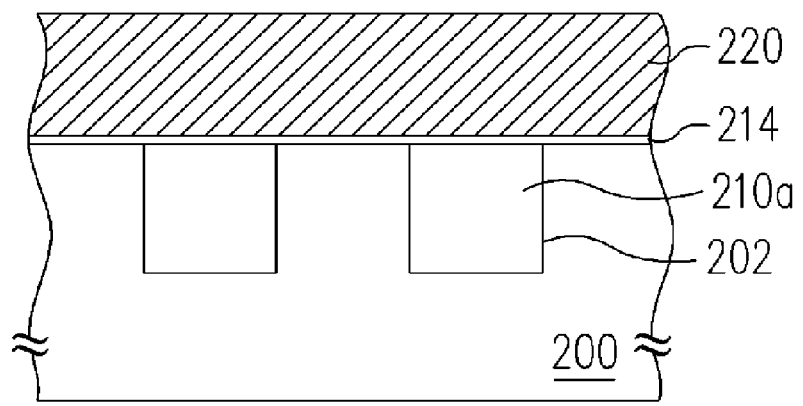

Then, referring to FIGS. 3D and 4D, a doping region 218 is formed on the bottom of each trench 204 and on the substrate 200 between two adjacent trenches 202. The doping region 218 is, for example, an N+ doping region, and formed by, for example, an ion implanting process. The lateral thickness of the isolation spacer 216 controls the position and the width of the doping region 218, which can further adjust the channel length of the memory cell.

Thereafter, a control gate layer 220 is filled into the trench 204. The control gate layer 220 is made of, for example, polysilicon, doped polysilicon or other appropriate conductive materials. To form the control gate layer 220, a control gate material layer (not shown) is formed on the substrate 200 by a CVD process, covering the entire structure, and a CMP process is then performed for removing the control gate material layer outside the trench 204, for example.

A doping region 222 is formed in the substrate 200 at both sides of the control gate layer 220. The doping region 222 is, for example, an N+ doping region, and formed by, for example, an ion implanting process. In addition, in an embodiment, the doping region 222 can be formed together with the doping region 218 in the above-described process.

Figure 2D:
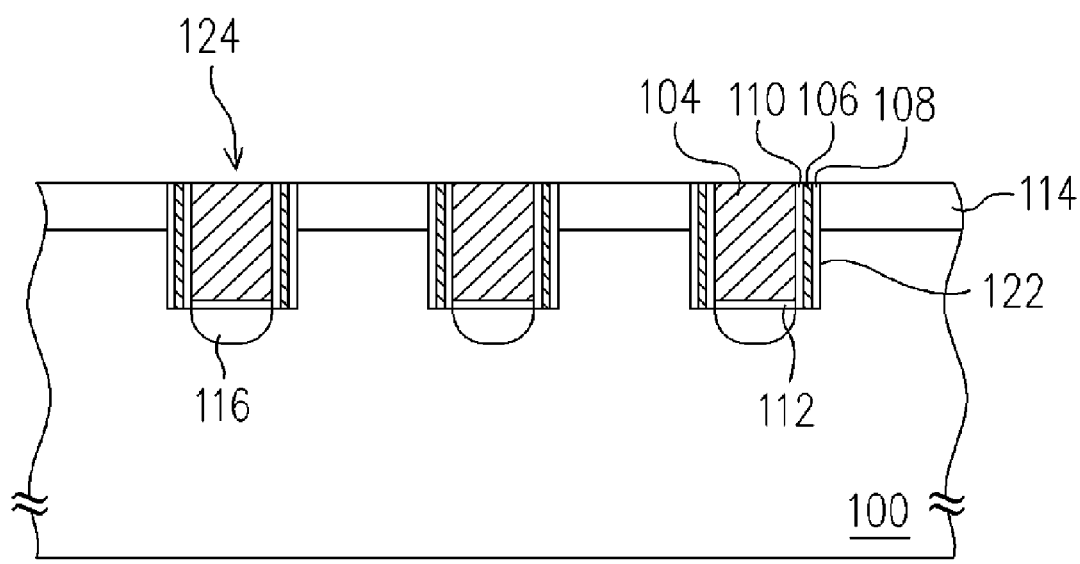
FIG. 2D is a schematic cross-sectional drawing of a non-volatile memory (NVM) according to yet another embodiment of the present invention.

Note that when the doping region 218 and the isolation spacers 216 are not formed, NVMs as shown in FIG. 2C can be fabricated, wherein a single charge storage layer 208 on each side of each memory unit (for example, 224 indicated in FIG. 3D) is capable of storing 1-bit individually. Thus, a memory unit, corresponding to two charge storage layers, has a memory cell (MC) for storing 2-bit in total. In a situation where a doping region 218 is formed with/without the isolation spacer 216 (as shown in FIGS. 2A and 2D, respectively), since the doping region 218 can serve as a source/drain region, each memory unit (for example, 224 indicated in FIG. 3D) contains two MCs at both sides thereof, one of which is used for storing 1-bit. Therefore, a memory unit can serve as a multi-stage MC.

From the above description, the NVM fabrication method of the present invention is suitable for forming a memory unit containing two storing bits, which effectively utilizes the limited space of a wafer and increases the device integration level. Moreover, the present invention provides an easier and more convenient process. In addition, for operating memories, the NVM of the present invention is particularly suitable for operating NOR NVMs.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A fabrication method of a non-volatile memory (NVM), comprising:
   providing a substrate;
   forming a plurality of first trenches and a plurality of second trenches in the substrate, wherein the second trenches are located above the first trenches and cross over the first trenches;
   sequentially forming a tunneling layer and a charge storage layer on a sidewall of each of the second trenches;
   filling an isolation layer into each of the first trenches;
   forming a charge barrier layer on a sidewall of each of the second trenches to cover the charge storage layer;
   forming a gate dielectric layer on the bottom of each of the second trenches, wherein the gate dielectric layer covers at least the substrate between two adjacent first trenches;
   filling a control gate layer into each of the second trenches;

forming a plurallty of first doping regions in the substrate at both sides of the control gate layer; and forming a second doping region at the bottom of each of the second trenches after forming the gate dielectric layer.

2. The fabrication method of a non-volatile memory as recited in claim 1, wherein before forming the second doping region, an isolation spacer is further formed an the charge barrier layer on the sidewall of each of the second trenches.

3. The fabrication method of a non-volatile memory as recited in claim 2, wherein the method of forming the isolation spacer comprises:

forming a spacer material layer in each of the second trenches; and anisotropically etching the spacer material layer.

4. The fabrication method of a non-volatile memory as recited in claim 1, wherein the method of forming the first trenches and the second trenches comprises:

using a first patterned mask to form the second trenches in the substrate, wherein the second trenches extend in a first extending direction; and using a second patterned mask to form the first trenches in the substrate in a second extending direction, wherein the first extending direction crosses the second extending direction.

5. The fabrication method of a non-volatile memory as recited in claim 1, wherein a depth of the first trenches is larger than that of the second trenches.

6. The fabrication method of a non-volatile memory as recited in claim 1, wherein the method of filling the isolation layer comprises:

forming an isolation material layer on the substrate;

performing a chemical mechanical polishing (CMP) process to remove the isolation material layer outside the second trenches until exposing the substrate between two adjacent second trenches; and performing an etching process to remove the isolation material layer in the second trenches until exposing the bottoms of the second trenches and exposing the substrate between two adjacent first trenches.

7. The fabrication method of a non-volatile memory as recited in claim 1, wherein the method of forming the gate dielectric layer comprises a thermal oxidation process.

8. The fabrication method of non-volatile memories as recited in claim 1, wherein the method of filling the control gate layer comprises:

forming a control gate material layer in each of the second trenches; and performing a chemical mechanical polishing (CMP) process to remove the control gate material layer outside each of the second trenches.

* * * * *